United States Patent
Chantre et al.

(10) Patent No.: US 9,507,089 B2
(45) Date of Patent: Nov. 29, 2016

(54) METHOD OF MANUFACTURING A PHOTONIC INTEGRATED CIRCUIT OPTICALLY COUPLED TO A LASER OF III-V MATERIAL

(71) Applicants: STMICROELECTRONICS SA, Montrouge (FR); STMICROELECTRONICS (CROLLES 2) SAS, Crolles (FR)

(72) Inventors: Alain Chantre, Seyssins (FR); Sébastien Cremer, Sassenage (FR)

(73) Assignees: STMICROELECTRONICS SA, Montrouge (FR); STMICROELECTRONICS (CROLLES 2) SAS, Crolles (FR)

(*) Notice: Subject to any disclaimer, the term of this patent is extended or adjusted under 35 U.S.C. 154(b) by 0 days.

(21) Appl. No.: 14/804,629

(22) Filed: Jul. 21, 2015

(65) Prior Publication Data
US 2016/0047986 A1    Feb. 18, 2016

(30) Foreign Application Priority Data

Aug. 18, 2014 (FR) .................... 14 57861

(51) Int. Cl.
| | | |
|---|---|---|
| G02B 6/12 | (2006.01) |
| G02B 6/10 | (2006.01) |
| C03B 37/022 | (2006.01) |
| H01L 21/00 | (2006.01) |
| H01L 31/102 | (2006.01) |
| G02B 6/136 | (2006.01) |
| H01S 5/343 | (2006.01) |
| H01S 5/026 | (2006.01) |
| H01S 5/02 | (2006.01) |
| G02B 6/132 | (2006.01) |
| G02B 6/42 | (2006.01) |

(52) U.S. Cl.
CPC .......... *G02B 6/136* (2013.01); *G02B 6/12004* (2013.01); *G02B 6/132* (2013.01); *G02B 6/4257* (2013.01); *H01S 5/021* (2013.01); *H01S 5/026* (2013.01); *H01S 5/343* (2013.01); *G02B 2006/121* (2013.01); *G02B 2006/12121* (2013.01)

(58) Field of Classification Search
CPC .... G02B 6/12004; G02B 6/136; G02B 6/13; G02B 2006/12121; H01S 5/005; H01S 5/021; H01S 5/022; H01S 5/0203
USPC ....... 385/14, 129–132, 141; 65/386; 438/22; 257/189
See application file for complete search history.

(56) References Cited

U.S. PATENT DOCUMENTS

| | | |
|---|---|---|
| 2003/0036123 A1 | 2/2003 | Brophy |
| 2010/0142580 A1 | 6/2010 | Gilet et al. |
| 2013/0082294 A1 | 4/2013 | Nakayama et al. |
| 2014/0044391 A1 | 2/2014 | Iizuka et al. |

*Primary Examiner* — Kaveh C Kianni
*Assistant Examiner* — Hung Lam
(74) *Attorney, Agent, or Firm* — Allen, Dyer, Doppelt, Milbrath & Gilchrist, P.A.

(57) ABSTRACT

A method of manufacturing an integrated circuit including photonic components on a silicon layer and a laser made of a III-V group material includes providing the silicon layer positioned on a first insulating layer that is positioned on a support. First trenches are etched through the silicon layer and stop on the first insulating layer, and the first trenches are covered with a silicon nitride layer. Second trenches are etched through a portion of the silicon layer, and the first and second trenches are filled with silicon oxide, which are planarized. The method further includes removing the support and the first insulating layer, and bonding a wafer including a III-V group heterostructure on the rear surface of the silicon layer.

20 Claims, 7 Drawing Sheets

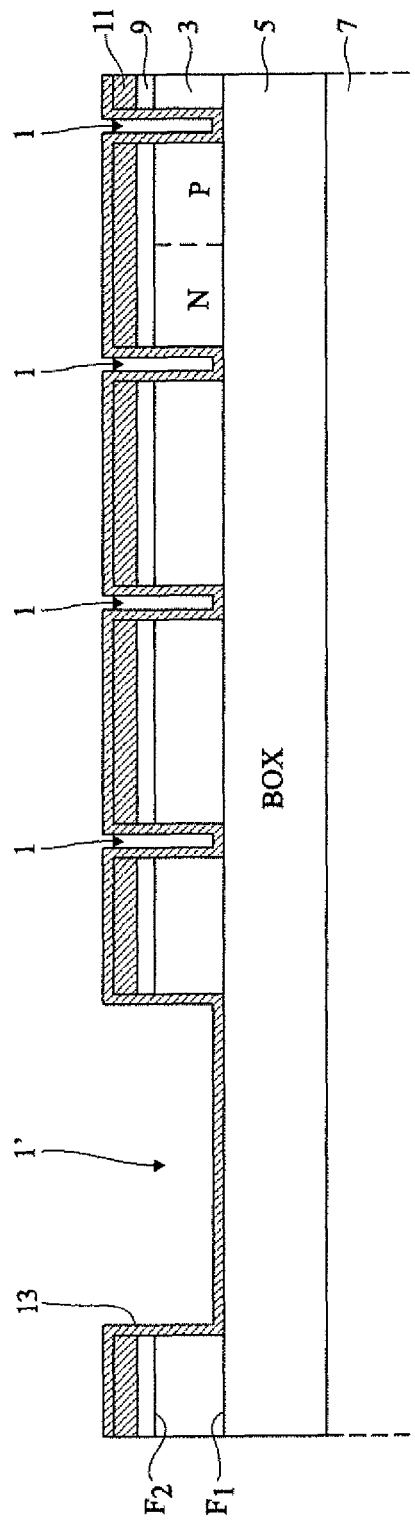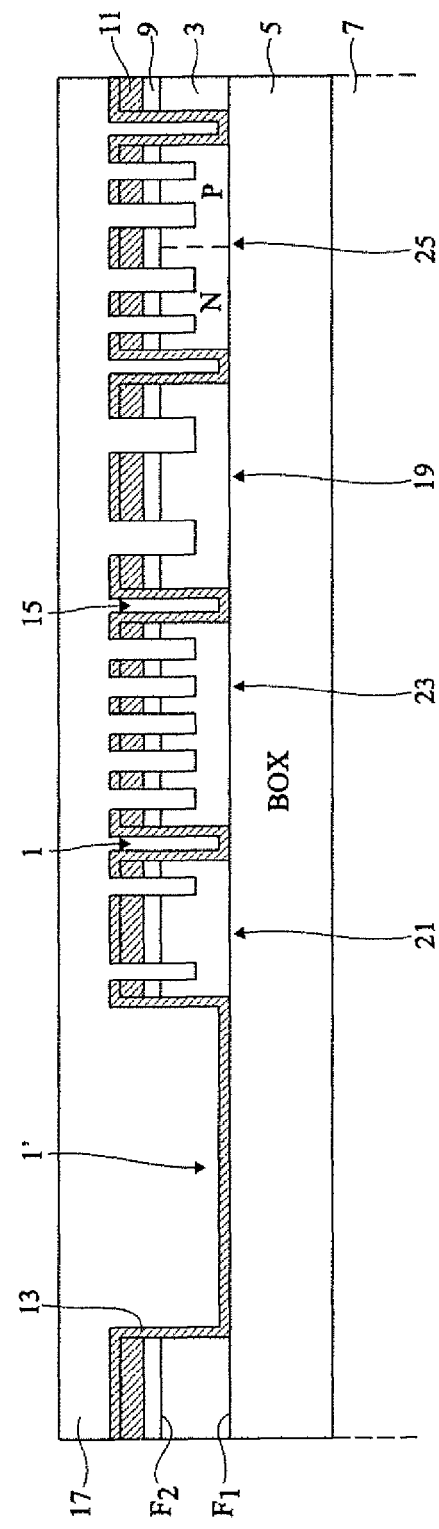

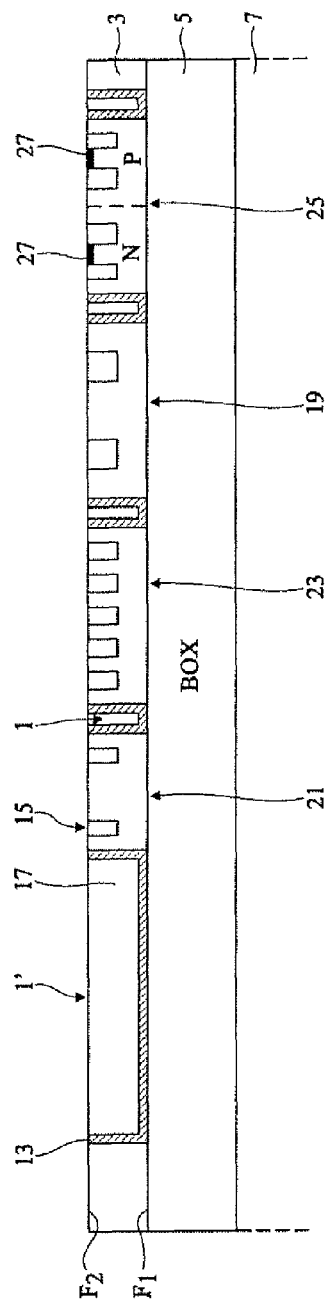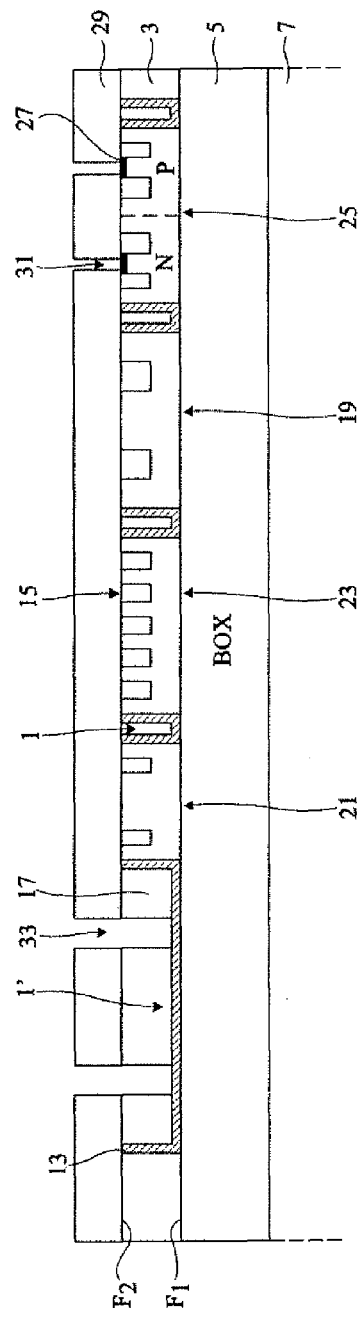

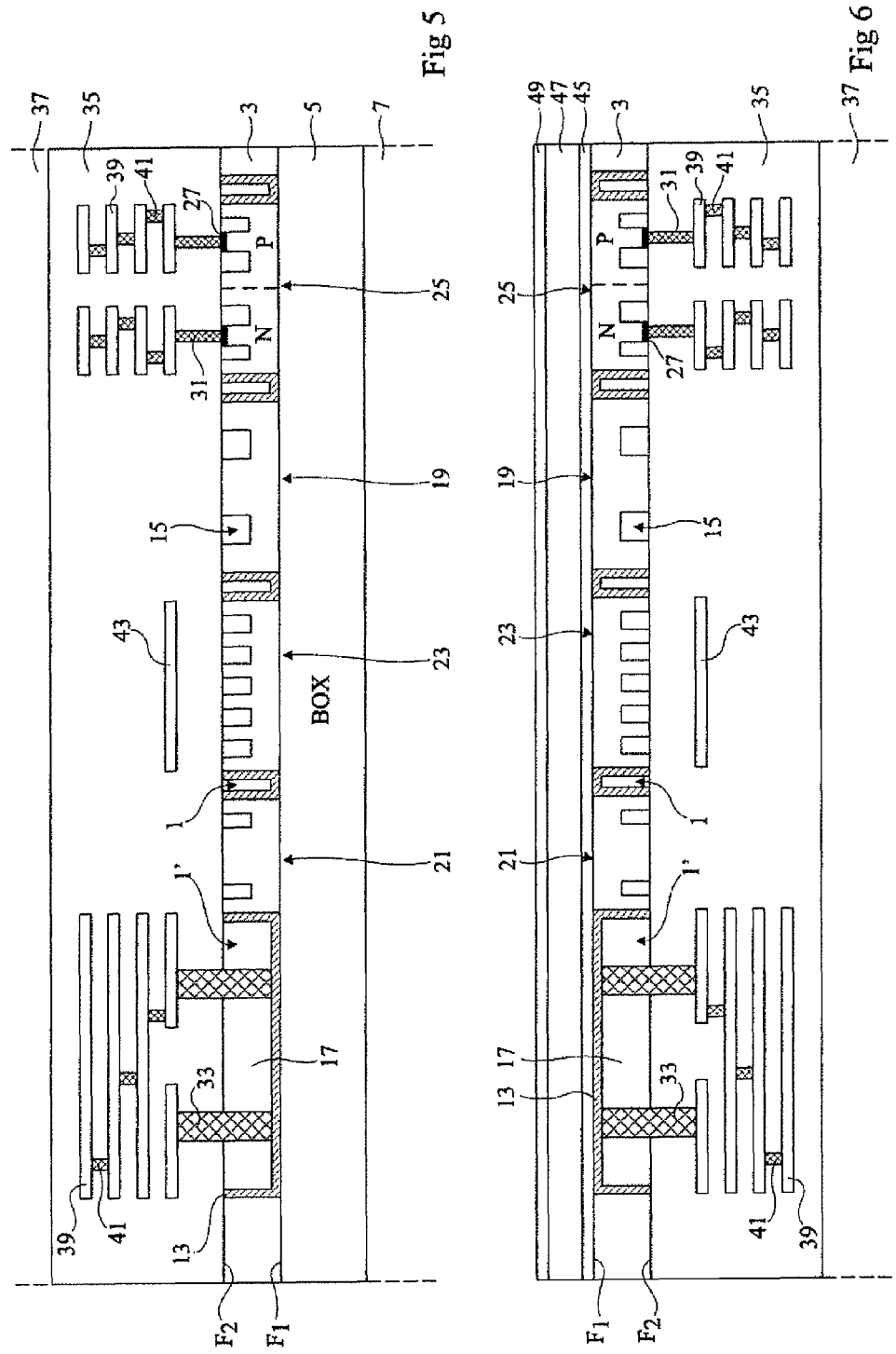

METHOD OF MANUFACTURING A PHOTONIC INTEGRATED CIRCUIT OPTICALLY COUPLED TO A LASER OF III-V MATERIAL

RELATED APPLICATION

This application claims the priority benefit of French Patent application number 14/57861 filed on Aug. 18, 2014, the entire contents of which are hereby incorporated by reference.

FIELD OF THE INVENTION

The present disclosure relates to a method of manufacturing an integrated circuit comprising photonic components on silicon and a laser made of III-V material, with one of the photonic components being a waveguide optically coupled to the laser.

BACKGROUND

Passive or active photonic components such as waveguides, coupling structures, modulators, photodetectors, for example, may be formed in a semiconductor layer, such as silicon, and may be associated to form a photonic integrated circuit. To connect these photonic components, an interconnection structure encapsulated in an insulating region is arranged on a surface of the silicon layer. The interconnection structure comprises a plurality of metallization levels connected together and to the photonic components by electrically-conductive vias.

A known advantageous photonic component is a laser comprising an amplifying medium made of a composite III-V semiconductor material optically coupled to a waveguide of a photonic integrated circuit. To assemble such a laser made of a III-V material and the elements of the integrated photonic circuit on silicon, a wafer of III-V materials comprising the laser elements may be placed on the silicon layer having the photonic components formed therein.

SUMMARY

An interconnection structure is arranged on a front surface of a silicon layer, and a layer of III-V materials is arranged on a rear surface side of the silicon layer.

A method of forming the above assembly and a photonic integrated circuit associated with a III-V laser is provided.

Thus, an embodiment provides a method of manufacturing an integrated circuit comprising photonic components on the silicon layer and a laser made of a III-V group material. The method may comprise the successive steps of a) providing the silicon layer having a front surface and a rear surface, with the rear surface being laid on a first insulating layer that is laid on a support; b) etching from the front surface to form first trenches through the silicon layer, stopping on the first insulating layer, and covering the walls and the bottom of the first trenches with a silicon nitride layer; c) etching from the front surface to form second trenches through a portion of a thickness of the silicon layer, the second trenches being formed at a location of at least some of the photonic components; d) filling the first and second silicon oxide trenches and planarizing the same to the front surface; e) removing the support and the first insulating layer, stopping on the rear surface and on the nitride layer; and f) bonding, on the rear surface, a wafer comprising a III-V heterostructure and etching the wafer to delimit the laser.

The method may comprise, between steps d) and e), the successive steps of g) covering the front surface with a second insulating layer; h) above a first trench, etching third trenches through the second insulating layer and the silicon oxide, stopping on the nitride layer, and filling the third trenches with a first metal to form first conductive vias; and i) forming, on the front surface, an interconnection structure comprising a metallization level in contact with the first conductive vias.

The method may further comprise, after step f), the successive steps of j) covering the interconnection structure and the laser with an insulating region having a planar exposed surface; and k) etching, opposite the rear side of the first vias, fourth trenches through the insulating region, stopping on the nitride layer, etching exposed portions of the nitride layer, and filling the fourth trenches with a second metal to form second conductive vias.

The method may comprise, at step h), a step of etching fifth trenches through the second insulating layer all the way to contacting regions of the photonic components of the integrated circuit, and a step of filling the fifth trenches with the first metal to form third conductive vias.

The material of the first insulating layer may be silicon oxide. The method may further comprise, at step f), depositing a silicon oxide layer on the rear surface prior to the bonding of the III-V wafer.

The III-V heterostructure may successively comprise, from the rear surface, a layer of doped III-V materials of a first conductivity type, a stack of III-V materials capable of forming quantum wells, and a layer of a doped III-V material of the second conductivity type.

The III-V plate may be bonded by molecular bonding at step f). A thickness of the silicon nitride layer may be in the range from 10 to 100 nm.

According to another aspect, a photonic integrated circuit comprises an interconnection structure arranged on a front surface of a silicon layer, and a laser comprising III-V composite materials on a rear surface of the silicon layer. In the silicon layer, photonic components including at least one waveguide may be optically coupled with the laser. Each photonic component may be delimited by first trenches extending from the front surface all the way to the rear surface. Each first trench may be coated with a silicon nitride layer and may be filled with silicon oxide. At least some of the components comprising second trenches may be filled with silicon oxide extending from the front surface across a portion of a thickness of the silicon layer.

The photonic integrated circuit may further comprise at least one first via extending from a metallization level of the interconnection structure to the bottom of the first trench. The circuit may further comprise at least one second via extending from the exposed surface of an insulating layer encapsulating the laser to at least one of the first vias.

BRIEF DESCRIPTION OF THE DRAWINGS

The foregoing and other features and advantages will be discussed in detail in the following non-limiting description of specific embodiments in connection with the accompanying drawings.

FIGS. 1 to 10 are simplified cross-sectional views illustrating successive steps of an embodiment of a method of manufacturing a photonic integrated circuit associated with a III-V laser.

For clarity, the same elements have been designated with the same reference numerals in the various drawings, which are not to scale.

DETAILED DESCRIPTION

Figure 7:
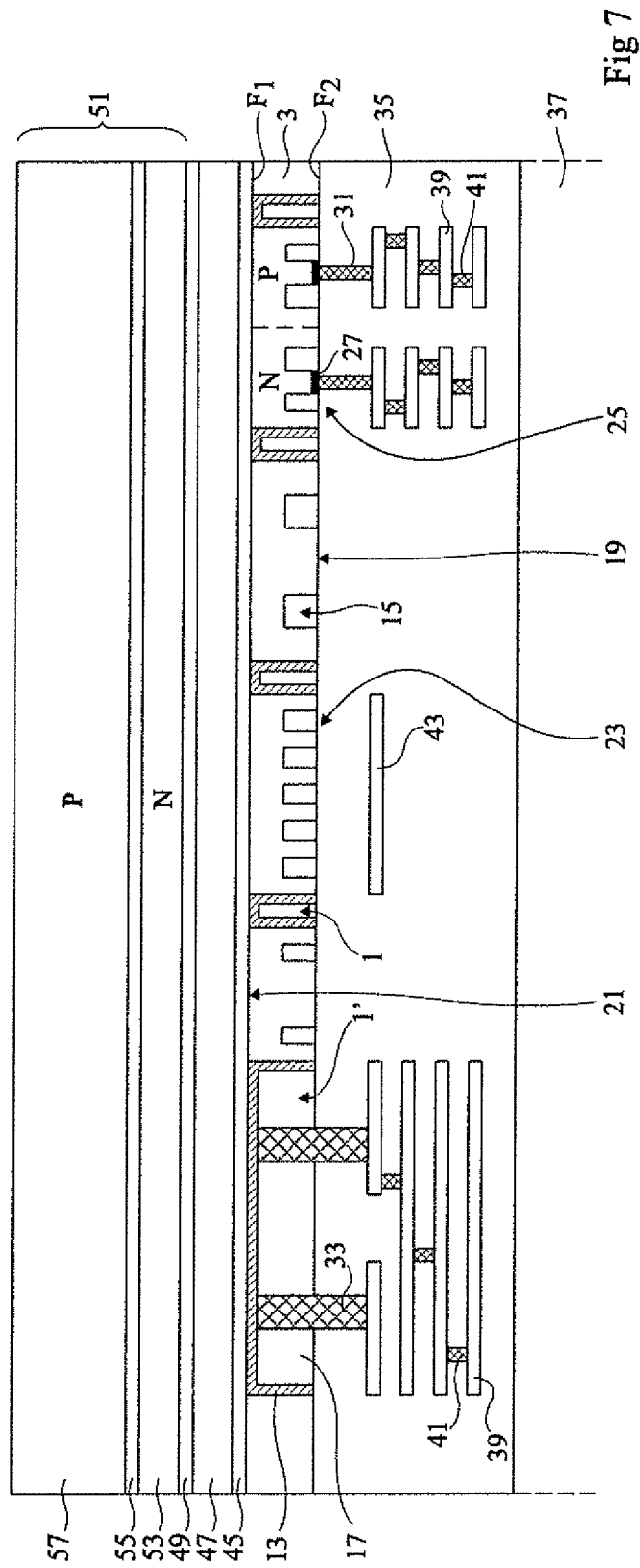

In the following description, unless otherwise indicated, terms approximately, on the order of, etc., mean to within 20%, and terms referring to directions, such as upper, above, lateral, bottom, etc., apply to devices arranged as illustrated in the corresponding cross-sectional views. However, it is understood that the devices may have different directions.

FIGS. 1 to 10 are simplified cross-sectional views illustrating successive steps of an embodiment of a method of manufacturing a photonic integrated circuit comprising photonic components formed in a semiconductor layer, such as silicon, and a III-V laser optically coupled to a waveguide in the photonic integrated circuit.

In FIG. 1, deep trenches 1 have been etched in an SOI-type (Silicon On Insulator) silicon layer 3 having a rear surface $F_1$ on an insulating layer 5. The insulating layer 5 may be, for example, a silicon oxide layer, designated by the acronym BOX (Buried OXide). The insulating layer 5 is on a support 7.

Before the etching, the front surface $F_2$ of the silicon layer 3 may be coated with one or more protection layers, such as a silicon oxide layer 9, for example. The silicon oxide layer 9 may be coated with a silicon nitride layer 11. The etching of trenches 1 is performed from the front surface $F_2$ of the silicon layer 3 all the way to the rear surface $F_1$ of the silicon layer 3.

After the etching, a silicon nitride layer 13 is deposited on the exposed surface of the structure so that the walls and the bottom of the deep trenches 1 are coated. Deep trenches 1 delimit portions of the silicon layer 3 where integrated photonic components will be formed.

During the etching of the deep trenches 1, certain trenches may be much wider than the others. Some of the wider trenches are intended, as will be discussed below, to receive interconnection vias. A single wider trench 1' is shown in the figures.

As an example, the support 7 is a silicon wafer. The thickness of the silicon layer 3 is, for example, in the range of 200 nm to 1 μm and may be equal to 300 nm. The thickness of the insulating layer 5 is, for example, in the range of 500 nm to 2.5 μm and may be equal to 700 nm. The thickness of the nitride layer 13 is, for example, in the range of 10 to 100 nm and may be equal to 30 nm.

FIG. 2 shows the structure after etching partial trenches 15 in the silicon layer 3. The partial trenches 15 are etched from the front surface $F_2$ of the silicon layer 3 across only a portion of a thickness of this layer. A depth of the the partial trenches 15 is typically approximately half the thickness of the silicon layer 3. Forming of the partial trenches 15 is followed by the deposition and the planarizing of silicon oxide 17 so as to fill the trenches 1, 1' and 15. The silicon oxide 17 is deposited by chemical vapor deposition, for example.

Waveguides 19 and 21, a coupler 23, and a modulator 25 are separated by the deep trenches 1 have been shown as an example. Each of these photonic components is conventionally defined in the silicon layer by the shape, position, and dimensions of partial trenches 15 filled with silicon oxide 17.

FIG. 3 shows the structure after a planarization that stops on the front surface $F_2$ of the silicon layer 3. This step may be carried out by chemical mechanical polishing, for example.

Steps of implanting doping species may be carried out to form one or more of N- or P-type doped regions in the silicon layer 3 to form doped regions of the integrated photonic modulator 25. Contacting regions 27 are then formed for contacting these doped regions.

FIG. 4 shows the structure after deposition of an insulating layer 29 on the front surface $F_2$, such as a silicon oxide layer, for example, followed by etching trenches 31 and 33 from the upper surface of the insulating layer 29. The trenches 31 extend through the insulating layer 29 all the way to the contacting regions 27. The trenches 33, formed adjacent or opposite the trench 1', extend through the insulating layer 29 and through the silicon oxide 17 so as to fill the trench 1' all the way to the nitride layer 13 while coating the bottom of the trench 1'.

This is one advantage of the silicon nitride layer 13, which is used as an etch stop layer. Indeed, in the absence of the nitride layer 13, the etching of the trenches 33 through the silicon oxide 17 may not be stopped by the insulating layer 5 (i.e., BOX).

FIG. 5 shows the structure after filling the trenches 31 and 33 with a metal to form conductive vias which will also be designated with the same references 31 and 33. The metal of the respective vias 31 and 33 may be tungsten.

After forming the vias 31 and 33, an interconnection structure is formed on the front surface $F_2$. The interconnection structure comprises metallization levels 39 separated by insulating regions generally designated with reference numeral 35, and associated by vias 41. The front side of each of the vias 31 and 33 is in contact with portions of at least some of the metallization levels 39 so that some of the photonic components are connected via the interconnection structure. Metallization levels 39 and vias 41 may be made of copper. The insulating regions 35 may comprise stacks of silicon oxide and silicon nitride layers, for example. The thickness of the assembly of the insulating regions 35 is in the range of 2 μm to 5 μm and may be equal to approximately 3 μm, for example.

It should be noted that, in forming the metallization levels, a portion 43 of one of these levels may be formed opposite the coupler 23. The metal layer portion 43 forms a mirror to reflect light originating from the coupler 23.

A handle 37 is then fastened by molecular bonding, for example, to the upper surface of the insulating regions 35 of the interconnection structure. The handle may be a silicon wafer, for example.

FIG. 6 shows the structure of FIG. 5 after flipping and removal of the support 7 and the insulating layer 5. The insulating layer 5 is removed from the rear surface $F_1$ of the silicon layer 3 and on the nitride layer 13.

This is another advantage of the silicon nitride layer 13. In the absence of this nitride layer, the removal of the silicon oxide forming the insulating layer 5 (BOX) may not be exactly stopped on the silicon oxide 17 filling the trenches 1 and 1'. If not exactly stopped, this would cause the structure to have a non-planar upper surface (i.e., on the rear surface $F_1$ of the silicon layer 3 in FIG. 6).

The rear surface $F_1$ of the silicon layer 3 is then coated with a thin silicon oxide layer 45 having a thickness, for example, in the range of 10 to 300 nm and may be equal to 100 nm. Since the presence of the silicon nitride layer 13 results in the rear surface $F_1$ being planar, the upper surface of the thin silicon oxide layer is also planar.

In certain embodiments, it may be useful to form a coupling element between the III-V amplifying medium of a laser and waveguide 19 formed in the silicon layer 3. In this case, as shown in FIG. 6, the thin silicon oxide layer 45 is coated with an amorphous silicon layer 47 which is also coated with a thin silicon oxide layer 49 having an upper surface that is also planar. The thickness of the amorphous silicon layer 47 is, for example, in the range from 200 nm to 300 nm and may be equal to approximately 200 nm.

FIG. 7 shows the structure onto which, on the, side of the rear surface $F_1$, a wafer or a chip comprising a heterostructure 51 of composite III-V semiconductor materials has been attached by molecular bonding. The heterostructure 51 comprises, from the side of the rear surface $F_1$, a layer 53 comprising an N-type doped III-V group semiconductor material, a stack of layers 55 forming quantum wells, and a layer 57 of a P-type doped composite III-V group semiconductor material. The heterostructure is initially on a support such as an InP substrate separated from the layer 57 by an etch stop layer. The support and the etch stop layer may be removed by etching the molecular bonding of the wafer or the chip comprising the heterostructure 51. The layer 53 may be a stack of InP and InGaAs layers. The thickness of the layer 53 may be approximately 200 nm, for example. The stack of layers 55 forming the quantum wells comprises InGaAsP layers. A thickness of the stack 55 may be on the order of 300 nm. The layer 57 is made of InP, for example. The thickness of the heterostructure 51 after removal of the support is, for example, in the range of 2 to 10 μm and may be equal to approximately 3 μm.

The presence of the silicon nitride layer 13 allows for a structure having its upper surface coated with a thin silicon oxide having a planar upper surface to be obtained, as shown in FIG. 6. The molecular bonding of the wafer 51 on this layer is particularly satisfactory.

Figure 8:
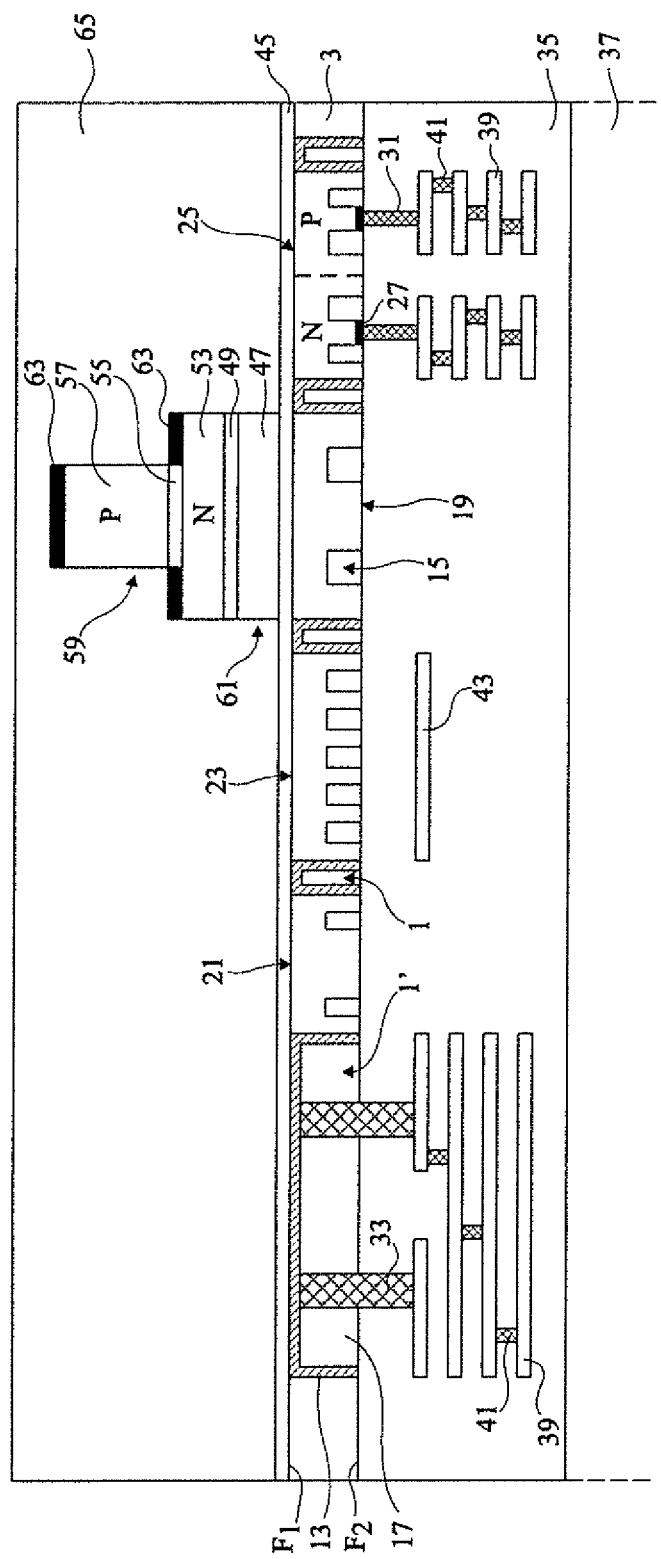

FIG. 8 shows the structure after etching the wafer 51 and the layers 49 and 47. In this example, a first etching is performed from the upper surface of the wafer 51 all the way to the thin layer 45 while leaving in place, preferably opposite the waveguide 19, portions of the layers 47 and 49. The layers 47 and 49 have a portion at least topped with portions of the layers 53, 55, and 57 of the wafer 51. A second etching is performed to remove lateral portions of the remaining portions of the layers 55 and 57. The remaining portions of the layers 53, 55, and 57 form the III-V amplifying medium 59 of a laser. The remaining portion of the layer 47 forms the coupler 61, such as a waveguide, for example, that optically couples the amplifying medium 59 to the waveguide 19 formed in the silicon layer 3.

These etch steps are followed by forming contacting regions 63 on the amplifying medium 59. More particularly, the contacting regions 63 are formed at the level of the upper surfaces of the remaining portions of the layers 57 and 53.

An insulating region 65 is then deposited on the side of the rear surface $F_1$ over the entire structure. The insulating region 65 may extend from the thin silicon oxide layer 45 to a level higher than that of the upper surface of the amplifying medium 59. The insulating region is, for example, a planarized silicon oxide layer.

Figure 9:
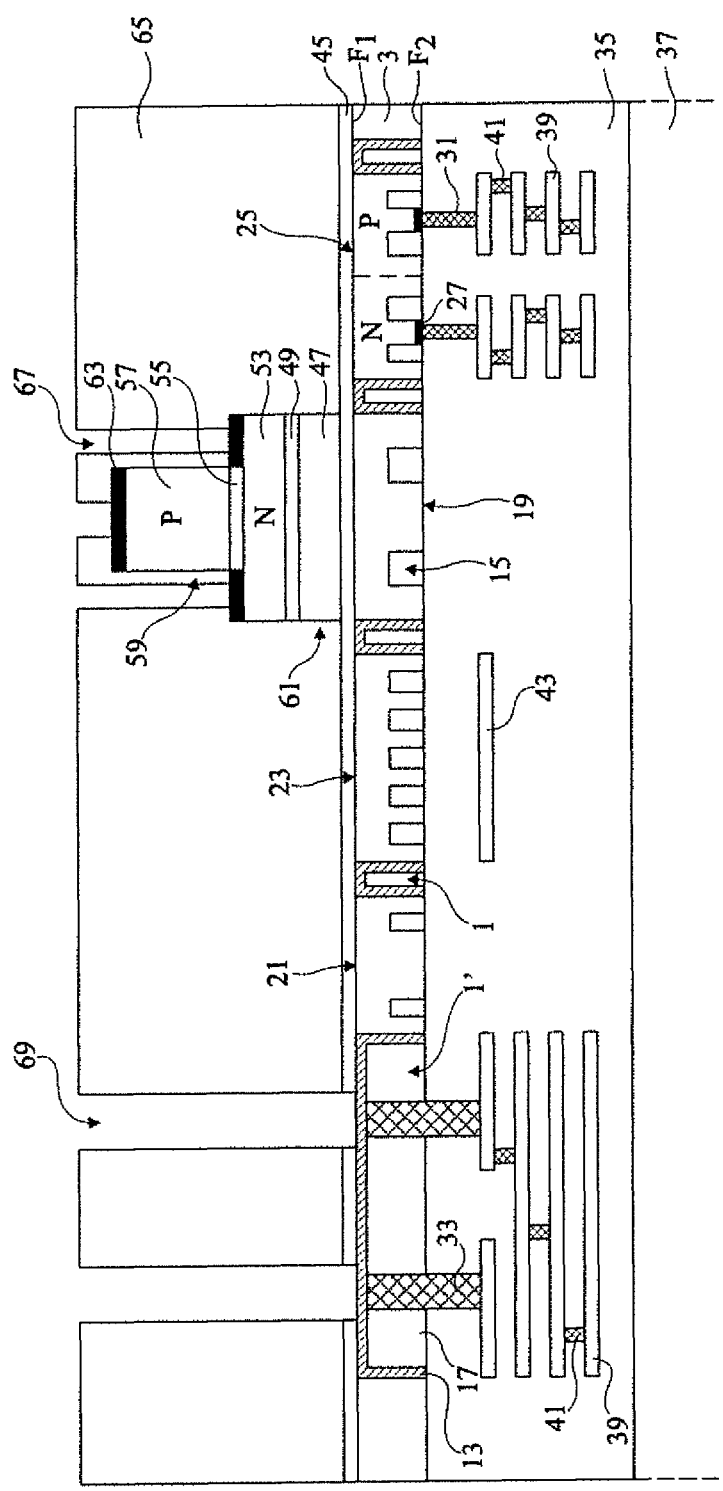

FIG. 9 shows the structure after etching of the trenches 67 and 69. Each trench 67 extends from the upper surface of the insulating region 65 to a contacting region 63. Each trench 69 is arranged opposite a via 33 and extends from the upper surface of the insulating region 65 to the silicon nitride layer 13 coating the bottom of the trench 1'.

This is yet another advantage of the silicon nitride layer 13, which is used as an etch stop layer. In the absence of the nitride layer 13, the etching of the trenches 69 through the silicon oxide of the insulating region 65 and of the thin layer 45 all the way to the rear sides of the vias 33 may result in an etching of the silicon oxide 17 filling the trenches 1 and 1'.

Figure 10:
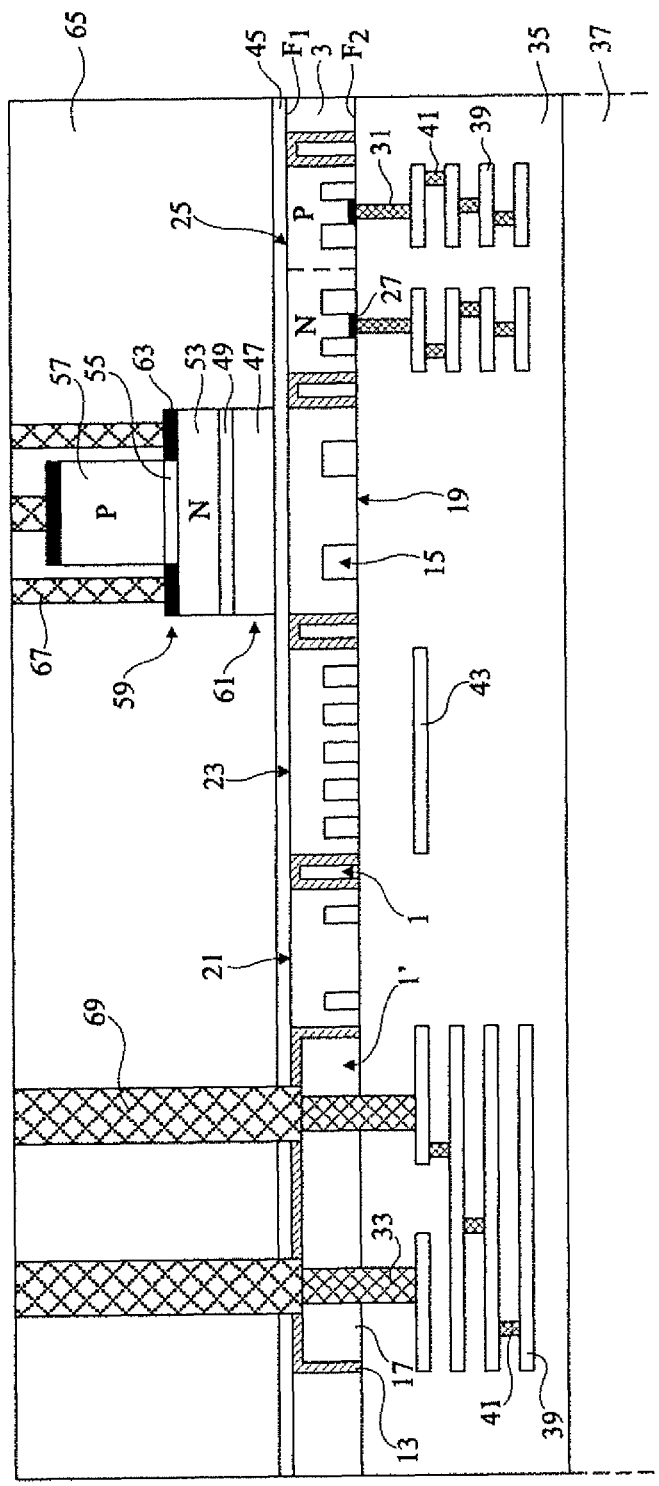

FIG. 10 shows the structure after etching the portion of the silicon nitride layer 13 arranged at the bottom of the trenches 69 to expose the metal of the vias 33 on the upper side thereof. This etch step is followed by the filling of the trenches 67 and 69 with a metal to form conductive vias which will also be designated with reference numerals 67 and 69.

Specific embodiments have been described. Various alterations, modifications, and improvements will readily occur to those skilled in the art. Although a manufacturing method where an amorphous silicon layer 47 and a thin silicon oxide 49 have been deposited on the thin silicon oxide layer 45 has been described. In alternative embodiments comprising no additional couplers 61, it is possible for the layers 47 and 49 not to be formed and for the wafer 51 of a III-V group material to be directly bonded to thin silicon oxide layer 45.

Many alternative embodiments of the III-V laser source and of the coupling of this source to a waveguide, with or without an intermediate coupler, may be provided. In alternative embodiments, the coupler 61 may be arranged on the side of the front surface $F_2$ of the silicon layer 3. In this case, before the deposition of the insulating layer 29, the deposition on the surface $F_2$ of a thin silicon oxide layer, of an amorphous silicon, and of another thin silicon oxide layer is then etched to form a coupler, is provided. It can thus be understood that the steps of the manufacturing method may be added or suppressed and that the order in which these steps are carried out may be modified.

Further, although the forming of a resonant cavity optically coupled to the waveguide 19 and to amplifying medium 59 of the laser has not been described, such a cavity may be conventionally formed by those skilled in the art. For example, the cavity may be farmed by etching Bragg networks at the level of the waveguide 19 or at the level of the coupler 61.

Advantages of the presence of the nitride layer 13 when the insulating layer 5 (BOX) is made of a same material as that filling the deep trenches 1 and 1' (e.g., silicon oxide), have been discussed. These advantages also remain when the materials of these regions are different and the removal of the material of the insulating layer 5 (BOX) is performed by etching, which is non-selective over the material filing the trenches 1 and 1'.

The arrangement, the shape, and the number of vias 31, 33, 41, 57, and 69, of metallization levels 39, and of photonic components 19, 21, 23, and 25 may be adapted by those skilled in the art. Other photonic components such as a photodetector may also be formed in the silicon layer 3.

Such alterations, modifications, and improvements are intended to be part of this disclosure, and are intended to be within the spirit and the scope of the present invention.

Accordingly, the foregoing description is by way of example only and is not intended to be limiting. The present invention is limited as defined in the following claims and the equivalents thereto.

What is claimed is:

1. A method of manufacturing an integrated circuit comprising photonic components on a silicon layer and a laser comprising a III-V group material, the method comprising:

a) providing the silicon layer having a front surface and a rear surface, with the rear surface on a first insulating layer that is on a support;

b) etching the front surface to form first trenches through the silicon layer and stopping on the first insulating layer, and covering walls and a bottom of the first trenches with a silicon nitride layer;

c) etching the front surface to form second trenches through a portion of the silicon layer, the second trenches being formed at a location of at least some of the photonic components;

d) filling the first and second trenches with silicon oxide and planarizing the silicon oxide to the front surface of the silicon layer;

e) removing the support and the first insulating layer, and stopping on the rear surface of the silicon layer and the silicon nitride layer; and f) bonding, on the rear surface of the silicon layer, a wafer comprising a III-V group heterostructure, and etching the wafer to delimit the laser.

2. The method of claim 1, further comprising between steps d) and e):

g) covering the front surface of the silicon layer with a second insulating layer;

h) above the first trenches, etching third trenches through the second insulating layer and the silicon oxide and stopping on the nitride layer, and filling the third trenches with a first metal to form first conductive vias; and forming, on the first conductive vias, an interconnection structure comprising a metallization level in contact with the first conductive vias;

the method further comprising, after step f):

covering the interconnection structure and the laser with an insulating region having a planar exposed surface; and etching, on the rear surface of the silicon layer, fourth trenches through the insulating region and stopping on the nitride layer, etching exposed portions of the nitride layer, and filling the fourth trenches with a second metal to form second conductive vias.

3. The method of claim 2, further comprising, at step h), etching fifth trenches through the second insulating layer to contacting regions of the photonic components of the integrated circuit, and filling the fifth trenches with the first metal to form third conductive vias.

4. The method of claim 1, wherein the first insulating layer comprises silicon oxide.

5. The method of claim 1, further comprising, at step f), depositing a silicon oxide layer on the rear surface of the silicon layer prior to bonding the wafer comprising the III-V group heterostructure.

6. The method of claim 1, wherein the III-V group heterostructure comprises from the rear surface of the silicon layer, a layer of doped III-V group material of a first conductivity type, a stack of layers of III-V group material forming quantum wells, and a layer of a doped III-V group material of the second conductivity type.

7. The method of claim 1, wherein the wafer comprising the III-V group heterostructure is bonded by molecular bonding at step f).

8. The method of claim 1, wherein a thickness of the silicon nitride layer is in a range from 10 to 100 nm.

9. A method for making a photonic integrated circuit comprising:

forming an interconnection structure on a front surface of a silicon layer;

forming a laser comprising a III-V group material on a rear surface of the silicon layer; and forming in the silicon layer photonic components having at least one waveguide optically coupled with the laser, each photonic component delimited by first trenches extending from the front surface of the silicon layer to the rear surface of the silicon layer, with each first trench coated with a silicon nitride layer and filled with silicon oxide, and at least some of the photonic components comprising second trenches filled with silicon oxide extending from the front surface of the silicon layer through a portion of the silicon layer.

10. The method of claim 9, further comprising forming an insulating region to encapsulate the laser on the rear surface of the silicon layer.

11. The method of claim 9, wherein forming the interconnection structure comprises:

forming a metallization level; and forming at least one first conductive via extending from the metallization level to a bottom of at least one of the first trenches; and wherein the insulating region has an exposed surface and comprises at least one second conductive via extending from the exposed surface of at least one of the first conductive vias.

12. The method of claim 9, further comprising a wafer comprising a III-V group heterostructure on the rear surface of the silicon layer, with the III--V group heterostructure forming the laser.

13. The method of claim 12, wherein the III-V group heterostructure comprises from the rear surface of the silicon layer, a layer of doped III-V group material of a first conductivity type, a stack of layers of III-V group material forming quantum wells, and a layer of a doped III-V group material of the second conductivity type.

14. The method circuit of claim 9, wherein a thickness of the silicon nitride layer is in a range from 10 to 100 nm.

15. A photonic integrated circuit comprising:

a silicon layer;

an interconnection structure on a front surface of said silicon layer;

a laser comprising a III-V group material on a rear surface of said silicon layer;

said silicon layer comprising photonic components having at least one waveguide optically coupled with said laser, each photonic component delimited by first trenches extending from the front surface of said silicon layer to the rear surface of said silicon layer level, with each first trench coated with a silicon nitride layer and filled with silicon oxide; and at least some of said photonic components comprising second trenches filled with silicon oxide extending from the front surface of said silicon layer through a portion of the silicon layer.

16. The photonic integrated circuit of claim 15, further comprising an insulating region encapsulating said laser on the rear surface of said silicon layer.

17. The photonic integrated circuit of claim 15, wherein said interconnection structure comprises:

a metallization level; and at least one first conductive via extending from said metallization level to a bottom of at least one of the first trenches; and wherein said insulating region has an exposed surface and comprises at least one second conductive via extending from the exposed surface of at least one of said first conductive vias.

18. The photonic integrated circuit of claim 15, further comprising a wafer comprising a III-V group heterostructure on the rear surface of said silicon layer, with the III-V group heterostructure forming said laser.

19. The photonic integrated circuit of claim 18, wherein the III-V group heterostructure comprises from the rear surface of said silicon layer, a layer of doped III-V group material of a first conductivity type, a stack of layers of III-V group material forming quantum wells, and a layer of a doped III-V group material of the second conductivity type.

20. The photonic integrated circuit of claim 15, wherein a thickness of said silicon nitride layer is in a range from 10 to 100 nm.

* * * * *